(12) United States Patent
Li

(10) Patent No.: US 12,274,008 B2
(45) Date of Patent: Apr. 8, 2025

(54) SOLDER-PRINTING STENCIL AND METHOD OF PRINTING SOLDER PASTE

(71) Applicant: SHENZHEN CHINA STAR OPTOELECTRONICS SEMICONDUCTOR DISPLAY TECHNOLOGY CO., LTD., Guangdong (CN)

(72) Inventor: Zhuhui Li, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/754,896

(22) PCT Filed: Mar. 22, 2022

(86) PCT No.: PCT/CN2022/082181
§ 371 (c)(1),
(2) Date: Apr. 14, 2022

(87) PCT Pub. No.: WO2023/155267
PCT Pub. Date: Aug. 24, 2023

(65) Prior Publication Data
US 2024/0306307 A1    Sep. 12, 2024

(30) Foreign Application Priority Data
Feb. 21, 2022   (CN) .......................... 202210154782.9

(51) Int. Cl.
*H05K 3/12*    (2006.01)
(52) U.S. Cl.
CPC ......... *H05K 3/1225* (2013.01); *H05K 3/1233* (2013.01); *H05K 2203/0139* (2013.01)

(58) Field of Classification Search
CPC .............. H05K 3/1225; H05K 3/1233; H05K 2203/0139
See application file for complete search history.

(56) References Cited

U.S. PATENT DOCUMENTS 5,819,652 A * 10/1998 Utter .................. B41C 1/14
428/137
2009/0072011 A1 * 3/2009 Sakaguchi .......... H01L 21/4853
228/41

(Continued)

FOREIGN PATENT DOCUMENTS

| CN | 204168608 U | 2/2015 |
| CN | 205213155 U | 5/2016 |

(Continued)

OTHER PUBLICATIONS

International Search Report in International application No. PCT/CN2022/082181, mailed on Nov. 23, 2022.

(Continued)

*Primary Examiner* — David H Banh
(74) *Attorney, Agent, or Firm* — PV IP PC; Wei Te Chung

(57) ABSTRACT

A solder-printing stencil and a method of printing solder paste are provided in the present application. A solder-printing stencil is used for printing a solder paste on a substrate in cooperation with a squeegee blade, the solder-printing stencil includes: a stencil body including a first region, a second region, and a third region, wherein the third region is defined between the first region and the second region, the third region is provided with a plurality of mesh holes spaced along a squeegeeing direction of the squeegee blade; and protruding portions are provided on a side of the stencil body facing the substrate, and the protruding portions are provided on both the first region and the second region.

20 Claims, 6 Drawing Sheets

(56) References Cited

U.S. PATENT DOCUMENTS

2012/0042795 A1* 2/2012 Walker ................. H05K 3/1225
                                                              101/129
2017/0141278 A1* 5/2017 Hamaguchi ........... H01L 33/385
2020/0391531 A1* 12/2020 Losiewicz ............... B41F 15/34

FOREIGN PATENT DOCUMENTS

| CN | 108091750 | A | 5/2018 |
| CN | 108365081 | A | 8/2018 |
| CN | 207854293 | U | 9/2018 |
| CN | 111916551 | A | 11/2020 |
| CN | 111993768 | A | 11/2020 |
| CN | 112669720 | A | 4/2021 |
| CN | 213305887 | U | 5/2021 |
| CN | 213920151 | U | 8/2021 |
| CN | 215243650 | U | 12/2021 |
| JP | H10270837 | A | 10/1998 |
| JP | 2011148145 | A | 8/2011 |

OTHER PUBLICATIONS

Written Opinion of the International Search Authority in International application No. PCT/CN2022/082181, mailed on Nov. 23, 2022.

Chinese Office Action issued in corresponding Chinese Patent Application No. 202210154782.9 dated Nov. 25, 2023, pp. 1-7.

\* cited by examiner

SOLDER-PRINTING STENCIL AND METHOD OF PRINTING SOLDER PASTE

FIELD OF INVENTION

The present application relates to a field of display technology, in particular to a solder-printing stencil and a method of printing solder paste.

BACKGROUND OF INVENTION

With rapid development of display industry, mini-LED products have attracted more and more attention. The most critical technology for the mini-LED products is bonding between LEDs and substrates.

In the related art, the bonding between the LEDs and the substrates needs to be completed by a solder paste process, the solder paste process is usually performed by a method of printing through a solder-printing stencil. However, the method of printing through the solder-printing stencil needs to apply the solder paste to the substrate using a squeegee blade on the solder-printing stencil, and the squeegee blade may apply a large force onto the substrate during a squeegeeing process, which may easily damage circuitry on the substrate.

SUMMARY OF INVENTION

Technical Problem

The present application provides a solder-printing stencil and a method of printing solder paste, which may prevent a squeegee blade from damaging a circuitry on a substrate during a squeegeeing process.

Technical Solution

In a first aspect, the present application provides a solder-printing stencil for printing a solder paste on a substrate in cooperation with a squeegee blade, the solder-printing stencil includes:
  a stencil body including a first region, a second region, and a third region, the third region being disposed between the first region and the second region, the third region being provided with a plurality of mesh holes spaced along a squeegeeing direction of the squeegee blade; and
  a protruding portion provided on a side of the stencil body facing the substrate, both of the first region and the second region being provided with the protruding portion, and the protruding portion having a strip shape.

In the solder-printing stencil provided by the present application, the solder-printing stencil has a first end and a second end oppositely disposed, and the protruding portion extends from the first end to the second end.

In the solder-printing stencil provided by the present application, a surface of a side of the protruding portion facing the substrate is flat.

In the solder-printing stencil provided in the present application, a first wire is provided on the substrate; and the protruding portion is arranged to avoid the first wire.

In the solder-printing stencil provided in the present application, a second wire is provided on the substrate; and the protruding portion is arranged to cross the second wire.

In the solder-printing stencil provided in the present application, the surface of the protruding portion facing the substrate is provided with a recessed sub-portion, and the recessed sub-portion is correspondingly defined at a position at which the protruding portion and the second wire cross with each other.

In the solder-printing stencil provided in the present application, the recessed sub-portion penetrates through the protruding portion along an extending direction of the second wire.

In the solder-printing stencil provided in the present application, the stencil body is any one of a planar stencil or a stepped stencil.

In the solder-printing stencil provided by the present application, a height of the protruding portion ranges from 2 microns to 5 microns.

In a second aspect, the present application provides a solder-printing stencil for printing a solder paste on a substrate in cooperation with a squeegee blade, and the solder-printing stencil includes:
  a stencil body including a first region, a second region, and a third region, the third region being disposed between the first region and the second region, the third region being provided with a plurality of mesh holes spaced along a squeegeeing direction of the squeegee blade; and
  a protruding portion provided on a side of the stencil body facing the substrate, and both of the first region and the second region being provided with the protruding portion.

In the solder-printing stencil provided by the present application, the solder-printing stencil has a first end and a second end oppositely disposed, and the protruding portion extends from the first end to the second end.

In the solder-printing stencil provided by the present application, a surface of a side of the protruding portion facing the substrate is flat.

In the solder-printing stencil provided in the present application, a first wire is disposed on the substrate; and the protruding portion is arranged to avoid the first wire.

In the solder-printing stencil provided in the present application, a second wire is provided on the substrate; and the protruding portion is arranged to cross the second wire.

In the solder-printing stencil provided in the present application, a surface of a side of the protruding portion facing the substrate is provided with a recessed sub-portion, and the recessed sub-portion is correspondingly disposed at a position at which the protruding portion and the second wire cross with each other.

In the solder-printing stencil provided in the present application, the recessed sub-portion penetrates through the protruding portion along an extending direction of the second wire.

In the solder-printing stencil provided in the present application, the stencil body is any one of a planar stencil or a stepped stencil.

In the solder-printing stencil provided by the present application, a height of the protruding portions ranges from 2 microns to 5 microns.

In a third aspect, the present application further provides a method of printing a solder paste, comprising:
  providing the solder-printing stencil described above;
  covering the substrate with the solder-printing stencil, wherein the mesh holes corresponds to positions of pads on the substrate, and a preset distance is set between the stencil body and the substrate;
  placing the solder paste on the solder-printing stencil and applying the solder paste to the solder-printing stencil with the squeegee blade; and
  removing the solder-printing stencil.

In the method of printing the solder paste provided in the present application, a height of the protruding portion ranges from 2 microns to 5 microns.

Advantageous Effects

According to the solder-printing stencil and the method of printing solder paste provided in the present application, by providing a protruding portion on the side of the stencil body facing the substrate, when printing the solder paste on the substrate, the pressure of the squeegee blade may be applied only to the protruding portion, and the circuitry on the substrate is not subjected to the pressure of the squeegee blade due to the presence of the protruding portion, so that the circuitry is not crushed or a short circuit does not occur; further, the conventional process of spraying the protective layer such as black oil before printing the solder paste may be omitted.

DESCRIPTION OF DRAWINGS

In order to illustrate the technical solutions in the embodiments of the present application more clearly, the accompanying drawings required in the description of the embodiments will be briefly described below. It will be apparent that the accompanying drawings in the following description are merely some embodiments of the present application, and other drawings may be obtained from these drawings without creative effort by those skilled in the art.

DETAILED DESCRIPTION OF EMBODIMENTS

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application.

The terms "first", "second", etc. in the description and claims of the present application are used to distinguish different objects, and do not have to be used to describe a specific order. The terms "including" and "having" and any variations thereof are intended to cover non-exclusive inclusions.

A solder-printing stencil provided in the embodiment of the present application is used for printing solder paste on a substrate in cooperation with a squeegee blade. The solder-printing stencil provided in the present application matches the substrate. It should be noted that, when printing the solder paste on the substrate, it is necessary to cover the substrate with the solder-printing stencil, and at a same time, to place the solder paste on the solder-printing stencil, and to coat the solder paste on the solder-printing stencil with the squeegee blade to coat the solder paste on pads of the substrate.

In the related art, when the solder paste is printed on the substrate using the solder-printing stencil, the squeegee blade may apply a large force to the substrate during the squeegeeing process, thereby easily damaging the circuitry on the substrate. Compared with the prior art, when the solder paste is printed on the substrate using the solder-printing stencil provided in the embodiment of the present application, it is possible to prevent pressure of the squeegee blade from being applied to the substrate, thereby preventing the circuitry on the substrate from being damaged.

Figure 1:
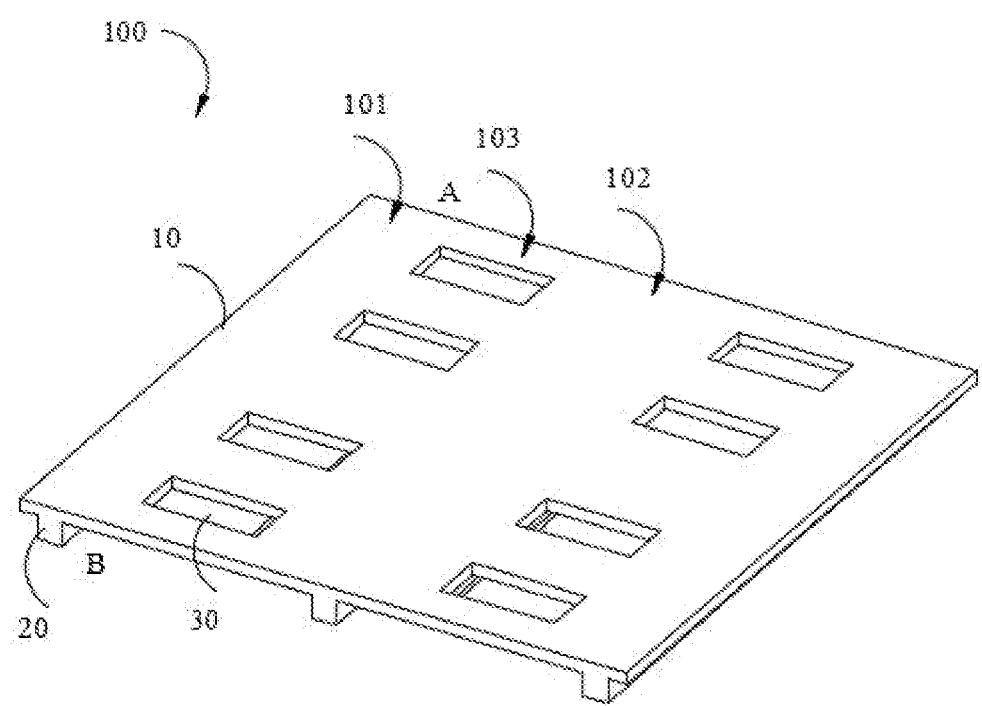
FIG. 1 is a schematic structural view of a solder-printing stencil according to an embodiment of the present application.

Referring to FIG. 1, FIG. 1 is a schematic structural diagram of a solder-printing stencil according to an embodiment of the present application. As shown in FIG. 1, a solder-printing stencil 100 provided in an embodiment of the present application includes a stencil body 10 and protruding portions 20. The protruding portions 20 are provided on a side of the stencil body 10 facing the substrate. It may be appreciated that when the solder paste is printed on the substrate using the solder-printing stencil 100 provided in the embodiments of the present application, the solder-printing stencil 100 may cover the substrate; at this time, the protruding portions 20 are defined between the stencil body 10 and the substrate, and the protruding portions 20 may support the squeegee blade while supporting the stencil body 10, so that the pressure of the squeegee blade may be applied only to the protruding portions 20, the circuitry on the substrate is not subjected to the pressure of the squeegee blade due to presence of the protruding portions 20, and thus the circuitry may not be crushed or a short circuit does not occur.

Wherein the stencil body 10 includes a first region 101, a second region 102, and a third region 103. The third region 103 is provided between the first region 101 and the second region 102. The third region 103 is provided with a plurality of mesh holes 30 spaced along a squeegeeing direction of the squeegee blade. The plurality of mesh holes 30 spaced along the squeegeeing direction of the squeegee blade correspond to a plurality of pads on the substrate spaced along the squeegeeing direction of the squeegee blade.

The protruding portions 20 are provided on the side of the stencil body 10 facing the substrate. Both of the first region 101 and the second region 102 are provided with the protruding portions 20. It may be understood that when the solder paste is printed on the substrate using the solder-printing stencil 100 according to the embodiment of the present application, the squeegee blade may be disposed on the stencil body 10 for squeegeeing, and the squeegee blade may be supported by two adjacent protruding portions 20.

Wherein a height of the protruding portion 20 ranges from 2 microns to 5 microns. For example, the height of the protruding portion 20 may be 2 microns. The height of the protruding portion 20 may be 5 microns. The height of the protruding portion 20 may be 3 microns. The height of the protruding portion 20 may be 4 microns. That is, according to the embodiment of the present application, by setting the height of the protruding portion, a highest part of the circuitry on the substrate is not subjected to the pressure of the squeegee blade due to the presence of the protruding portion, so the circuitry may not be crushed or a short circuit does not occur.

In the solder-printing stencil 100 according to the embodiment of the present application, the protruding portions 20 are provided on the first region 101 and the second region 102. When the solder paste is printed on the substrate using the solder-printing stencil 100 according to the embodiment of the present application, the pressure of the squeegee blade is applied to the protruding portions 20 on the first region 101 and the second region 102, and the circuitry on the substrate is not subjected to the pressure of the squeegee blade due to the presence of the protruding portions 20 on the first region 101 and the second region 102, so the circuitry may not be crushed or a short circuit does not occur. That is, the solder-printing stencil 100 according to the embodiment of the present application may bear the pressure of the squeegee blade by providing the protruding portions 20.

In an embodiment of the present application, the protruding portion 20 may be provided in a strip shape. Specifically, the solder-printing stencil 100 includes a first end A and a second end B which are oppositely disposed. The protruding portion 20 extends from the first end A to the second end B, and a direction from the first end A to the second end B is the squeegeeing direction of the squeegee blade. That is, a length of the protruding portion 20 may be set in accordance with a distance from the first end A to the second end B of the substrate. A width of the protruding portion 20 may be set according to the actual situation of the circuitry on the substrate. That is, the width of the protruding portion 20 should be set so as to avoid the circuitry on the substrate as far as possible.

In an embodiment of the present application, a surface of a side of the protruding portion 20 facing the substrate is flat. When the solder paste is printed on the substrate using the solder-printing stencil 100 provided in the embodiment of the present application, the solder-printing stencil 100 needs to be placed on the substrate. The surface of the side of the protruding portion 20 facing the substrate may be in contact with the substrate. According to the embodiment of the present application, the surface of the side of the protruding portion 20 facing the substrate is set to be flat, so that it is possible to avoid shaking of the solder-printing stencil 100 during the squeegeeing process of the squeegee blade.

In an embodiment of the present application, the stencil body 10 is any one of a planar stencil or a stepped stencil. The stepped stencil is formed to have two or more thicknesses on a same stencil plate, so as to cope with the fact that all electronic parts of a large or small size appear on the same side of the circuit board at a same time, thereby improving soldering quality. The stepped stencil may be locally thickened to increase a thickness of the stencil to increase an amount of solder paste printed, or locally thinned to decrease the thickness of the stencil to reduce the amount of solder paste printed. Accordingly, the mesh holes 30 may be provided in a stepped shape to increase a thickness of the solder in some regions and reduce the thickness of the solder in some regions. This arrangement enables the solder paste in corresponding mesh holes 30 to be rapidly separated and collected on the pads of the substrate, thereby reducing a risk of solder short (or solder bridge).

Figure 2:
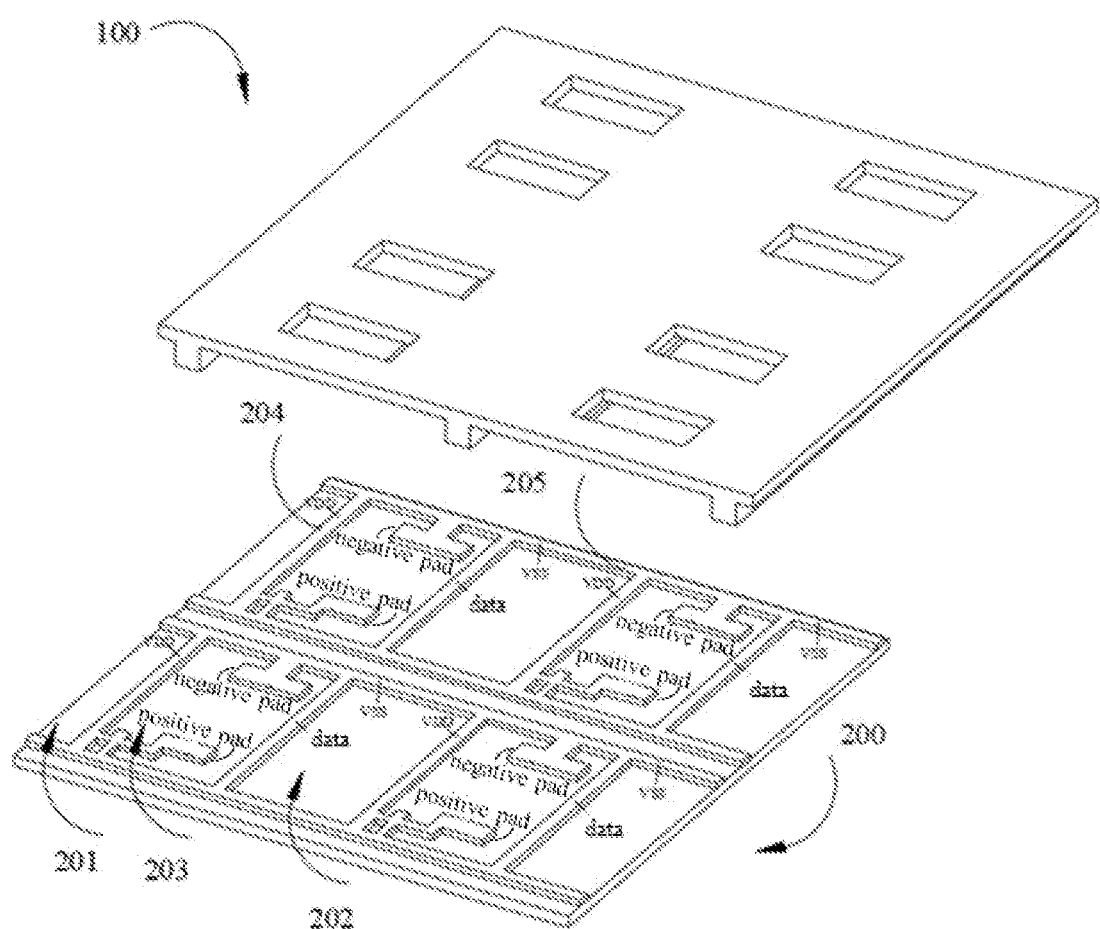
FIG. 2 is a schematic view of matching a solder-printing stencil with a substrate according to an embodiment of the present application.

Further, referring to FIG. 2, FIG. 2 is a schematic diagram of matching a solder-printing stencil with a substrate according to an embodiment of the present application. Referring to FIGS. 1 and 2 in combination, the substrate 200 includes a first substrate region 201, a second substrate region 202, and a third substrate region 203. The third substrate region 203 is defined between the first substrate region 201 and the second substrate region 202. When the solder paste is printed on the substrate 200 using the solder-printing stencil 100 according to the embodiment of the present application, the first substrate region 201 corresponds to the first region 101, the second substrate region 202 corresponds to the second region 102, and the third substrate region 203 corresponds to the third region 103.

A circuitry is provided on the third substrate region 203. Specifically, a plurality of pads and two first wires 204 are provided on the third substrate region 203. Two second wires 205 extend across the first substrate region 201, the second substrate region 202, and the third substrate region 203. A plurality of pads are spaced apart from each other along the squeegeeing direction of the squeegee blade. That is, a plurality of pads are arranged in a column. The column of pads has a first side, a second side, a third side, and a fourth side; the first side and the second side are opposite to each other, and the third side and the fourth side are opposite to each other. The first wires 204 extend along the squeegeeing direction of the squeegee blade. A first first wire 204 is disposed near the first side, and a second first wire 204 is disposed near the second side. The second wire 205 extends in a direction intersecting the squeegeeing direction of the squeegee blade. A first second wire 205 is disposed near the third side, and a second second wire 205 is disposed near the fourth side. The two second wires 205 both extend to the first substrate region 201 and the second substrate region 202.

The plurality of pads may include a plurality of positive pads and a plurality of negative pads. The positive pads and the negative pads are alternately disposed in the squeegeeing direction of the squeegee blade. The first first wire 204 may be a VDD line, the second first wire 204 may be a data line, the first second wire 205 may be a VSS line, and the second second wire 205 may be a scan line.

Figure 3:
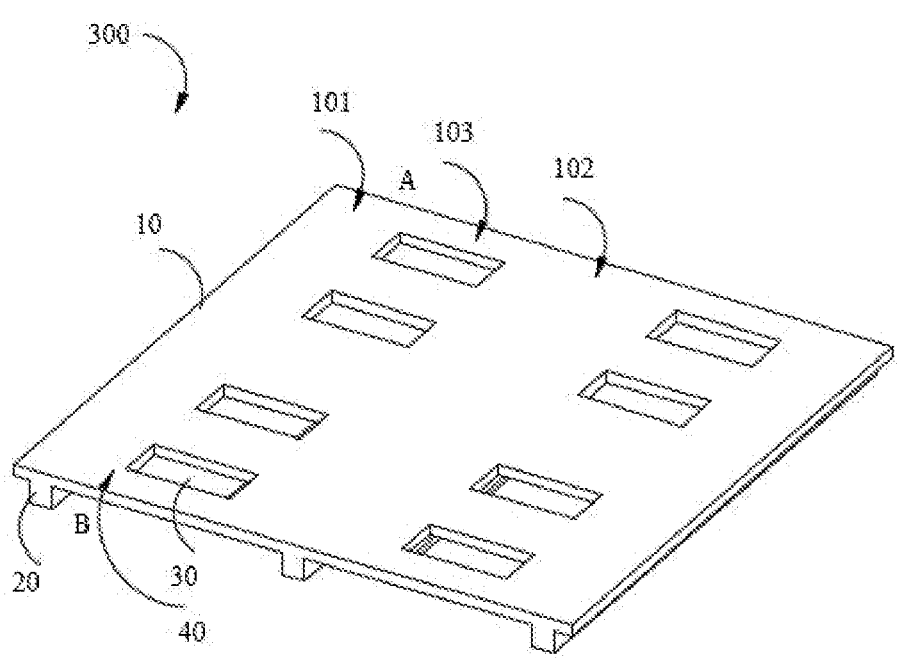
FIG. 3 is another schematic structural view of a solder-printing stencil according to an embodiment of the present application.

In the solder-printing stencil provided in the embodiment of the present application, by providing the protruding portions 20 on the first region 101 corresponding to the first substrate region 201 and the second region 102 corresponding to the second substrate region 202 respectively, when the solder paste is printed on the substrate 200 by using the solder-printing stencil 100 provided in the embodiment of the present application, the pressure of the squeegee blade may be applied only to the protruding portion 20 on the first region 101 corresponding to the first substrate region 201 and the protruding portion 20 on the second region 102 corresponding to the second substrate region 202, and the circuitry on the third substrate region 203 is not subjected to the pressure of the squeegee blade because of the presence of the protruding portions 20 on the first region 101 and the second region 102, so that the circuitry may not be crushed or a short circuit does not occur Referring to FIG. 3, FIG. 3 is another structural diagram of a solder-printing stencil according to an embodiment of the present application. The solder-printing stencil 300 shown in FIG. 3 differs from the solder-printing stencil 100 shown in FIG. 1 in that a recessed sub-portion is provided on the surface of the side of the protruding portions 20 of the solder-printing stencil 300 facing the substrate.

As shown in FIG. 3, the solder-printing stencil 300 according to the embodiment of the present application includes a stencil body 10 and protruding portions 20. The protruding portions 20 are provided on a side of the stencil body 10 facing the substrate. A recessed sub-portion 40 is provided on a surface of the side of the protruding portion 20 facing the substrate. It may be understood that, when the solder paste is printed on the substrate using the solder-printing stencil 300 provided in the embodiment of the present application, the solder-printing stencil 300 may cover the substrate; at this time, the protruding portion 20 is defined between the stencil body 10 and the substrate, and the protruding portion 20 may support the squeegee blade while supporting the stencil body 10, so that the pressure of the squeegee blade may be applied only to the protruding portion 20, the circuitry on the substrate is not subjected to the pressure of the squeegee blade due to the presence of the protruding portion 20, and thus the circuitry may not be crushed or a short circuit does not occur.

Wherein the stencil body 10 includes a first region 101, a second region 102, and a third region 103. The third region 103 is provided between the first region 101 and the second region 102. The third region 103 is provided with a plurality of mesh holes 30 spaced along a squeegeeing direction of the squeegee blade. The plurality of mesh holes 30 spaced along the squeegeeing direction of the squeegee blade correspond to a plurality of pads on the substrate spaced along the squeegeeing direction of the squeegee blade.

Wherein the protruding portion 20 is provided on the side of the stencil body 10 facing the substrate. Each of the first region 101 and the second region 102 is provided with a protruding portion 20. It may be understood that when the solder paste is printed on the substrate using the solder-printing stencil 300 according to the embodiment of the present application, the squeegee blade may be disposed on the stencil body 10 for squeegeeing, and the squeegee blade may be supported by two adjacent protruding portions 20.

The height of the protruding portion 20 ranges from 2 microns to 5 microns. For example, the height of the protruding portion 20 may be 2 microns. The height of the protruding portion 20 may be 5 microns. The height of the protruding portions 20 may be 3 microns. The height of the protruding portions 20 may be 4 microns. That is, according to the embodiment of the present application, by setting the height of the protruding portions, the highest part of the circuitry on the substrate is not subjected to the pressure of the squeegee blade due to the presence of the protruding portion, so the circuitry may not be crushed or a short circuit does not occur.

Figure 4:
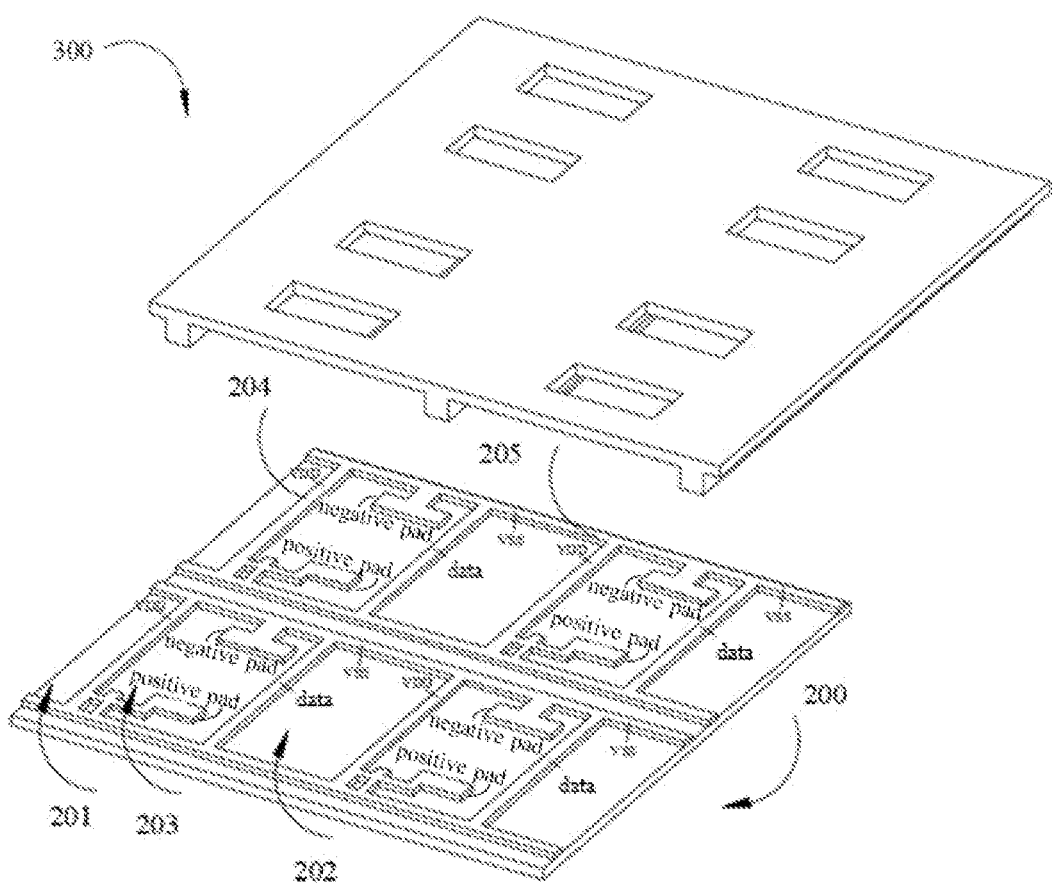
FIG. 4 is another schematic view of matching a solder-printing stencil with a substrate according to an embodiment of the present application.

Further, referring to FIG. 4, FIG. 4 is another schematic diagram of matching a solder-printing stencil with a substrate according to an embodiment of the present application. Referring to FIGS. 3 and 4 in combination, the substrate 200 includes a first substrate region 201, a second substrate region 202, and a third substrate region 203. The third substrate region 203 is defined between the first substrate region 201 and the second substrate region 202. When the solder paste is printed on the substrate 200 using the solder-printing stencil 300 according to the embodiment of the present application, the first substrate region 201 corresponds to the first region 101, the second substrate region 202 corresponds to the second region 102, and the third substrate region 203 corresponds to the third region 103.

A circuitry is provided on the third substrate region 203. Specifically, a plurality of pads and two first wires 204 are provided on the third substrate region 203. Two second wires 205 extend across the first substrate region 21, the second substrate region 202, and the third substrate region 203. A plurality of pads are spaced apart from each other along the squeegeeing direction of the squeegee blade. That is, a plurality of pads are arranged in a column. The column of pads has a first side, a second side, a third side, and a fourth side, the first side and the second side are opposite to each other, and the third side and the fourth side are opposite to each other. The first wires 204 extend along the squeegeeing direction of the squeegee blade. A first first wire 204 is disposed near the first side, and a second first wire 204 is disposed near the second side. The second wire 205 extends in a direction intersecting the squeegeeing direction of the squeegee blade. A first second wire 205 is disposed near the third side, and a second second wire 205 is disposed near the fourth side. The two second wires 205 both extend to the first substrate region 201 and the second substrate region 202.

The plurality of pads may include a plurality of positive pads and a plurality of negative pads. The positive pad and the negative pad are alternately disposed in the squeegeeing direction of the squeegee blade. The first first wire 204 may be a VDD line, the second first wire 204 may be a data line, the first second wire 205 may be a VSS line, and the second second wire 205 may be a scan line.

Figure 5:
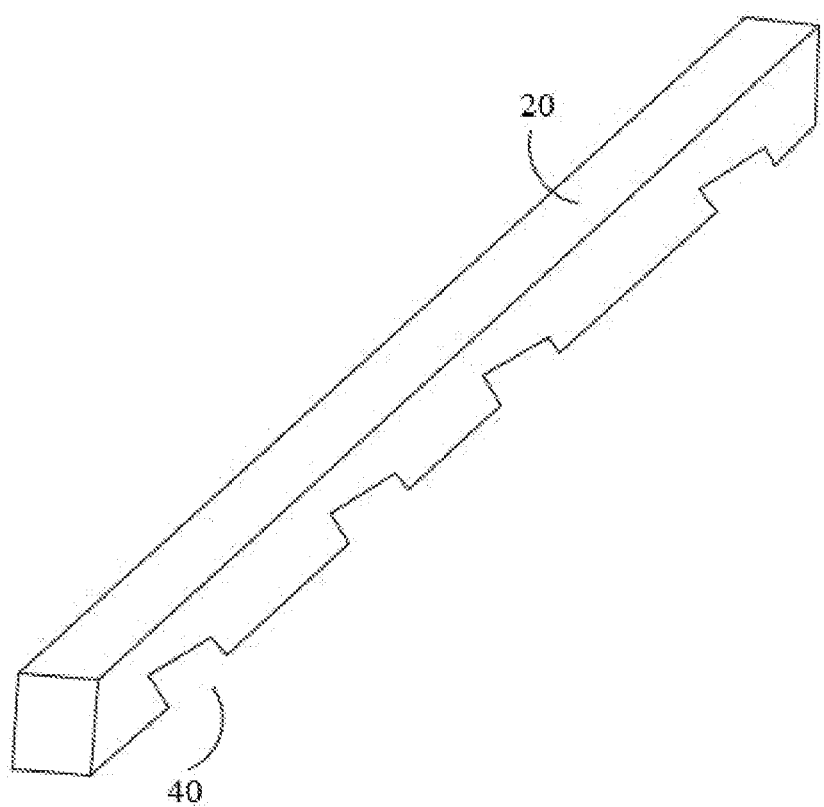
FIG. 5 is an enlarged schematic view of protruding portions shown in FIGS. 3 and 4.

Further, referring to FIG. 5, FIG. 5 is an enlarged schematic view of the protruding portion shown in FIG. 3 and FIG. 4. As shown in FIG. 5, recessed sub-portions 40 are provided on a surface of a side of the protruding portion 20 facing the substrate 200.

Wherein the recessed sub-portions 40 are provided corresponding to an intersection between the protruding portion 20 and the second wire 205, respectively. The recessed sub-portion 40 penetrates the protruding portion 20 along an extending direction of the second wire 205. According to the embodiment of the present application, by providing the recessed sub-portion 40, when the solder paste is printed on the substrate 200, the second wire 205 is accommodated in the recessed sub-portion 40, the pressure of the squeegee blade may be applied only to the protruding portion 20, and the circuitry on the substrate 200 is not subjected to the pressure of the squeegee blade due to the presence of the protruding portion.

In the solder-printing stencil 300 according to the embodiment of the present application, by providing the protruding portions 20 on the first region 101 and the second region 102, when the solder paste is printed on the substrate using the solder-printing stencil 300 according to the embodiment of the present application, the pressure of the squeegee blade may be applied only to the protruding portions 20 on the first region 101 and the second region 102, and the circuitry on the substrate is not subjected to the pressure of the squeegee blade because of the presence of the protruding portions 20 on the first region 101 and the second region 102, so that the circuitry may not be crushed or a short circuit does not occur. That is, the solder-printing stencil 300 according to the embodiment of the present application may bear the pressure of the squeegee blade by providing the protruding portions 20.

In an embodiment of the present application, the protruding portions 20 may be provided in a strip shape. Specifically, the solder-printing stencil 300 includes a first end A and a second end B which are oppositely disposed. The protruding portion 20 extends from the first end A to the second end B, and a direction from the first end A to the second end B is the squeegeeing direction of the squeegee blade. That is, a length of the protruding portion 20 may be set in accordance with a distance from the first end A to the second end B of the substrate. A width of the protruding portion 20 may be set according to the actual situation of the circuitry on the substrate. That is, the width of the protruding portion 20 should be set so as to avoid the circuitry on the substrate as far as possible.

In an embodiment of the present application, a surface of a side of the protruding portion 20 facing the substrate is flat. When the solder paste is printed on the substrate using the solder-printing stencil 300 provided in the embodiment of the present application, the solder-printing stencil 300 needs to be placed on the substrate. The surface of the side of the protruding portion 20 facing the substrate may be in contact with the substrate. According to the embodiment of the present application, the surface of the side of the protruding portion 20 facing the substrate is set to be flat, so that it is possible to avoid shaking of the solder-printing stencil 300 during the squeegeeing process of the squeegee blade.

In an embodiment of the present application, the stencil body 10 is any one of a planar stencil or a stepped stencil. The stepped stencil is formed to have two or more thicknesses on a same stencil plate, so as to cope with the fact that all electronic parts of a large or small size appear on the same side of the circuit board at a same time, thereby improving soldering quality. The stepped stencil may be locally thickened to increase a thickness of the stencil to increase an amount of solder paste printed, or locally thinned to decrease the thickness of the stencil to reduce the amount of solder paste printed. Accordingly, the mesh holes 30 may be provided in a stepped shape to increase a thickness of the solder in some regions and reduce the thickness of the solder in some regions. This arrangement enables the solder paste in corresponding mesh holes 30 to be rapidly separated and collected on the pads of the substrate, thereby reducing a risk of solder bridge.

In the solder-printing stencil 300 according to the embodiment of the present application, by providing the protruding portions 20 on the first region 101 corresponding to the first substrate region 201 and the second region 102 corresponding to the second substrate region 202 respectively, when the solder paste is printed on the substrate 200 by using the solder-printing stencil 300 provided in the embodiment of the present application, the pressure of the squeegee blade may be applied only to the protruding portions 20 on the first region 101 corresponding to the first substrate region 201 and the second region 102 corresponding to the second substrate region 202, and the circuitry on the third substrate region 203 is not subjected to the pressure of the squeegee blade because of the presence of the protruding portions 20 on the first region 101 and the second region 102, so that the circuitry may not be crushed or a short circuit does not occur. At a same time, according to the embodiment of the present application, by providing the recessed sub-portion 40, when the solder paste is printed on the substrate 200, the second wire 205 is accommodated in the recessed sub-portion 40, the pressure of the squeegee blade may be applied only to the protruding portion 20, and the circuitry on the substrate 200 is not subjected to the pressure of the squeegee blade due to the presence of the protruding portion.

Figure 6:
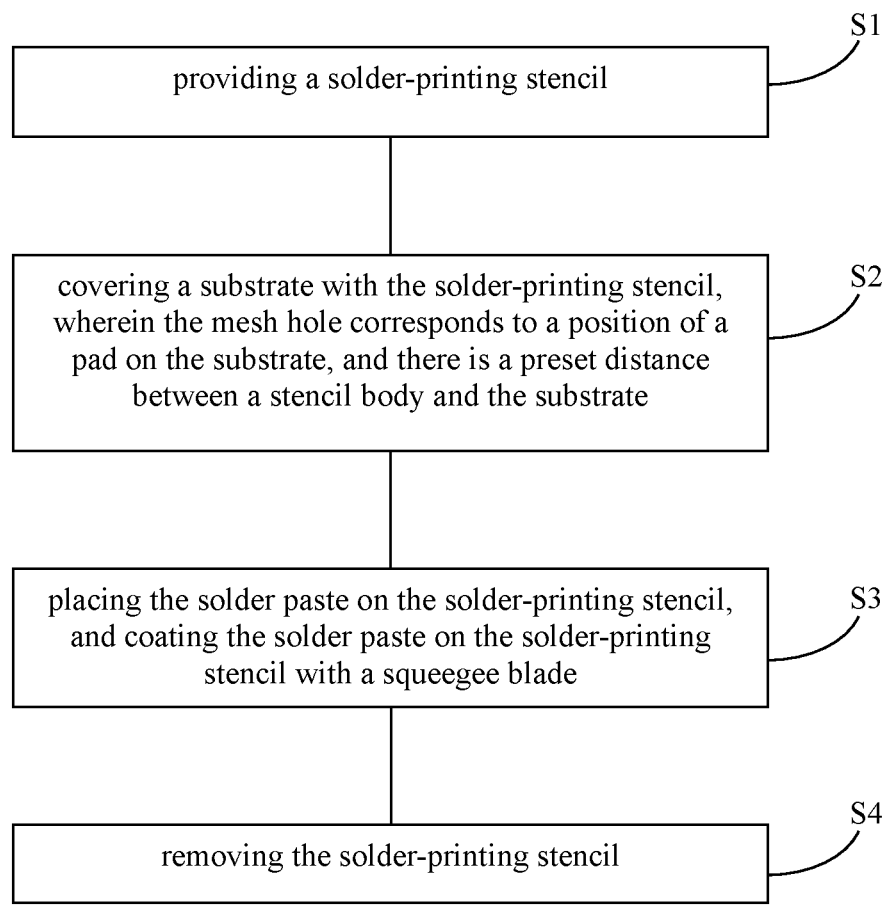
FIG. 6 is a flowchart of a method of printing a solder paste according to an embodiment of the present application.

Referring to FIG. 6, FIG. 6 is a flowchart of a method of printing a solder paste according to an embodiment of the present application. As shown in FIG. 6, the method of printing the solder paste according to an embodiment of the present application includes following steps:

Step S1: providing a solder-printing stencil;

Step S2: covering a substrate with the solder-printing stencil, wherein mesh holes correspond to positions of pads on the substrate, and there is a preset distance between a stencil body and the substrate.

Step S3, placing the solder paste on the solder-printing stencil, and coating the solder paste on the solder-printing stencil with a squeegee blade.

Step S4: removing the solder-printing stencil.

The solder-printing stencil may refer to the solder-printing stencil described in the above embodiment, and details are not described here.

It should be noted that the preset distance may be set as required. In embodiments of the present application, the preset distance ranges from 2 microns to 5 microns. For example, the preset distance may be 2 microns. The preset distance may be 5 microns. The preset distance may be 3 microns. The preset distance may be 4 microns. That is, in the embodiment of the present application, by providing the protruding portions to limit the distance between the stencil body and the substrate, it is possible that the highest part of the circuitry on the substrate is not subjected to the pressure of the squeegee blade due to the presence of the protruding portion, so the circuitry may not be crushed or a short circuit does not occur.

According to the method of printing solder paste provided in the present application, due to the action of the protruding portions, the circuitry on the substrate is not subjected to the pressure of the squeegee blade due to the presence of the protruding portions, so that the circuitry is not crushed or a short circuit does not occur, and a common process of spraying a protective layer such as black oil before printing solder paste may be omitted.

The solder-printing stencil and the method of printing solder paste provided in the present application are described in detail above. The principles and implementations of the present application are described in detail here with specific examples. The above description of the embodiments is merely intended to help understand the method and core ideas of the present application. At the same time, those of ordinary skill in the art may make changes in the specific embodiments and application scope according to the idea of the present application. In conclusion, the content of the present specification should not be construed as a limitation to the present application.

What is claimed is:

1. A solder-printing stencil, the solder-printing stencil is for printing a solder paste on a substrate in cooperation with a squeegee blade, wherein the solder-printing stencil comprises:

a stencil body, the stencil body comprising a first region, a second region, and a third region, wherein the third region is defined between the first region and the second region, and the third region is provided with a plurality of mesh holes spaced along a squeegeeing direction of the squeegee blade; and a protruding portion, the protruding portion provided on a side of the stencil body facing the substrate, wherein both of the first region and the second region are provided with the protruding portion, and the protruding portion has a strip shape;

wherein a second wire is disposed on the substrate, and the protruding portion is arranged to cross the second wire; and a surface of the protruding portion facing the substrate is provided with a recessed sub-portion, and the recessed sub-portion is correspondingly defined at a position the protruding portion and the second wire cross with each other.

2. The solder-printing stencil according to claim 1, wherein the solder-printing stencil has a first end and a second end oppositely disposed, and the protruding portion extends from the first end to the second end.

3. The solder-printing stencil according to claim 2, wherein a surface of a side of the protruding portion facing the substrate is flat.

4. The solder-printing stencil according to claim 1, wherein a first wire is disposed on the substrate, and the protruding portion is arranged to avoid the first wire.

5. The solder-printing stencil according to claim 1, wherein the recessed sub-portion penetrates the protruding portion along an extending direction of the second wire.

6. The solder-printing stencil according to claim 1, wherein the stencil body is any one of a planar stencil or a stepped stencil.

7. The solder-printing stencil according to claim 1, wherein a height of the protruding portion ranges from 2 microns to 5 microns.

8. A solder-printing stencil for printing a solder paste on a substrate in cooperation with a squeegee blade, wherein the solder-printing stencil comprises:
- a stencil body, the stencil body comprising a first region, a second region, and a third region, wherein the third region is defined between the first region and the second region, and the third region is provided with a plurality of mesh holes spaced along a squeegeeing direction of the squeegee blade; and
- a protruding portion, the protruding portion provided on a side of the stencil body facing the substrate, wherein both of the first region and the second region are provided with the protruding portion;
- wherein a second wire is disposed on the substrate, and the protruding portion is arranged to cross the second wire and a surface of a side of the protruding portion facing the substrate is provided with a recessed sub-portion, and the recessed sub-portion is correspondingly defined at a position the protruding portion and the second wire cross with each other.

9. The solder-printing stencil according to claim 8, wherein the solder-printing stencil has a first end and a second end oppositely disposed, and the protruding portion extends from the first end to the second end.

10. The solder-printing stencil according to claim 9, wherein a surface of a side of the protruding portion facing the substrate is flat.

11. The solder-printing stencil according to claim 8, wherein a first wire is disposed on the substrate, and the protruding portion is arranged to avoid the first wire.

12. The solder-printing stencil according to claim 8, wherein the recessed sub-portion penetrates the protruding portion along an extending direction of the second wire.

13. The solder-printing stencil according to claim 8, wherein the stencil body is any one of a planar stencil or a stepped stencil.

14. The solder-printing stencil according to claim 8, wherein a height of the protruding portion ranges from 2 microns to 5 microns.

15. A method of printing a solder paste comprising:
providing a solder-printing stencil;
covering a substrate with the solder-printing stencil, wherein the mesh holes correspond to positions of pads on the substrate, and a preset distance is set between the stencil body and the substrate;
placing the solder paste on the solder-printing stencil and applying the solder paste to the solder-printing stencil with the squeegee blade; and
removing the solder-printing stencil;
wherein the solder-printing stencil comprises:
- a stencil body, the stencil body comprising a first region, a second region, and a third region, wherein the third region is defined between the first region and the second region, and the third region is provided with a plurality of mesh holes spaced along a squeegeeing direction of the squeegee blade; and
- a protruding portion, the protruding portion provided on a side of the stencil body facing the substrate, wherein both of the first region and the second region are provided with the protruding portion;
- wherein a second wire is disposed on the substrate, and the protruding portion is arranged to cross the second wire and a surface of a side of the protruding portion facing the substrate is provided with a recessed sub-portion, and the recessed sub-portion is correspondingly defined at a position the protruding portion and the second wire cross with each other.

16. The method of printing the solder paste according to claim 15, wherein a height of the protruding portion is ranges from 2 microns to 5 microns.

17. The method of printing the solder paste according to claim 15, wherein the solder-printing stencil has a first end and a second end oppositely disposed, and the protruding portion extends from the first end to the second end.

18. The method of printing the solder paste according to claim 15, wherein a surface of a side of the protruding portion facing the substrate is flat.

19. The method of printing the solder paste according to claim 15, wherein a first wire is disposed on the substrate, and the protruding portion is arranged to avoid the first wire.

20. The method of printing the solder paste according to claim 15, wherein the recessed sub-portion penetrates the protruding portion along an extending direction of the second wire.

* * * * *